(12) United States Patent
Mori et al.

(10) Patent No.: US 8,096,802 B2
(45) Date of Patent: Jan. 17, 2012

(54) NANOIMPRINT STAMPER AND A FINE-STRUCTURE TRANSFER APPARATUS USING THE STAMPER

(75) Inventors: Kyoichi Mori, Kodama-gun (JP);
Noritake Shizawa, Kodama-gun (JP);
Susumu Komoriya, Kodama-gun (JP);
Akihiro Miyauchi, Hitachi (JP);
Takashi Ando, Hitachi (JP); Tetsuhiro Hatogai, Chiyoda-ku (JP)

(73) Assignee: Hitachi High-Technologies Corporation, Tokyo (JP)

( * ) Notice: Subject to any disclaimer, the term of this patent is extended or adjusted under 35 U.S.C. 154(b) by 186 days.

(21) Appl. No.: 12/534,232

(22) Filed: Aug. 3, 2009

(65) Prior Publication Data
US 2010/0034911 A1    Feb. 11, 2010

(30) Foreign Application Priority Data

Aug. 7, 2008  (JP) ................................. 2008-204040

(51) Int. Cl.
*B29C 59/00* (2006.01)
*B29B 13/08* (2006.01)
(52) U.S. Cl. ...................... 425/385; 425/174.4; 264/293
(58) Field of Classification Search .................. 425/385, 425/174.4; 264/293
See application file for complete search history.

(56) References Cited

U.S. PATENT DOCUMENTS

| | | | | |
|---|---|---|---|---|
| 5,817,242 | A | * | 10/1998 | Biebuyck et al. ............... 216/41 |
| 5,843,626 | A | * | 12/1998 | Ohta et al. ..................... 430/320 |
| 6,309,580 | B1 | * | 10/2001 | Chou ............................ 264/338 |

FOREIGN PATENT DOCUMENTS

JP        2007-55235 A     3/2007

OTHER PUBLICATIONS

S.Y. Chou et al., Imprint of sub-25 nm vias and trenches in polymers, Appl. Phys. Lett., vol. 67 No. 21, Nov. 20, 1995, pp. 3114-3116.
Y. Hirai, Nanostructure Fabrication by Nanoimprint Technology, Journal of the Japan Society for Precision Engineering, vol. 70, No. 10, 2004, pp. 1223-1227.
J. Taniguchi et al., Recent trend of nanoimprint technique, Journal of the Society for Abrasive Technology, vol. 46, No. 6, Jun. 2002, pp. 282-285.

* cited by examiner

*Primary Examiner* — Maria Veronica Ewald
(74) *Attorney, Agent, or Firm* — Mattingly & Malur, PC

(57) ABSTRACT

A nanoimprint stamper can simultaneously conform to two types of anomaly in the shape of a transfer substrate, for example warpage and surface protrusions (including foreign objects) that differ greatly in the wavelength of variation. The nanoimprint stamper is capable of performing transfer with a smaller number of defects and in a uniform way. The nanoimprint stamper includes a light-transmitting rigid substrate, a light-transmitting resilient plate, a light-trarsmitting and flexible rigid stamper base, a light-transmitting stamper buffer layer, and a light-transmitting patterned stamp layer. The stamper buffer layer has a lower Young's modulus than the patterned stamp layer.

14 Claims, 8 Drawing Sheets

NANOIMPRINT STAMPER AND A FINE-STRUCTURE TRANSFER APPARATUS USING THE STAMPER

TECHNICAL FIELD

The present invention relates to a nanoimprint stamper and a fine-structure transfer apparatus (nanoimprint apparatus) using the stamper. More particularly, the present invention relates to a nanoimprint stamper that can simultaneously conform to two types of anomaly in the shape of a transfer substrate, i.e., a warpage and surface protrusions that differ greatly in the wavelength of variation, as well as a fine-structure transfer apparatus (nanoimprint apparatus) using the stamper.

BACKGROUND ART

With remarkable advances in the performance of computers and other information equipment, the volume of information that is handled by users has been constantly increasing and is now measured in gigabytes as a unit. Under these circumstances, there exists an ever-growing demand for semiconductor devices such as information storage/reproduce equipment and memories that are capable of recording at even higher densities.

To achieve higher recording densities, technologies for even finer microfabrication are required. Conventional photolithography which uses the exposure process is capable of microfabrication over a large area in one step; however, since its resolution is not finer than the wavelength of light, conventional photolithography is inevitably unsuitable for creating fine structures smaller than the wavelength of light (say, 100 nm and less). Technologies currently available for processing finer structures than the wavelength of light include exposure using electron beams, exposure using X-rays, and exposure using ion beams. However, pattern formation with an electron beam lithographic apparatus differs from patterning by one-shot exposure using such light sources as i-line and an excimer laser in that the more patterns that need be written with electron beams, the longer the time that is required for writing (exposure). Therefore, as the recording density increases, the time it takes to form a fine pattern is extended to cause a marked drop in throughput. With a view to forming patterns at a faster speed by the e-beam lithographic equipment, the development of a method for one-shot irradiation of geometric figures is underway in which combinations of variously shaped masks are subjected to one-shot exposure to electron beams; however, the e-beam lithographic apparatus that uses the method for one-shot irradiation of geometric figures is not only bulky but it also needs an additional mechanism for controlling the positions of masks to an even higher precision; this increases the cost of the lithographic apparatus, eventually leading to a higher cost for manufacturing media.

Printing-based approaches have been proposed as an alternative to the conventional exposure technologies for creating fine structures smaller than the wavelength of light. See, for example, the article titled "Imprint of sub-25 nm vias and trenches in polymers" that is carried in Non-Patent Document 1. Nanoimprint lithography (NIL) is a technique in which a pattern of a predetermined fine structure is formed on a master by exposure to electron beams or using some other methods of creating finer structures than the wavelength of light and the master is urged under pressure against a resist-coated transfer substrate so that the fine structured pattern is transferred to the resist layer on the transfer substrate. As long as the master is available, there is no particular need to employ an expensive exposure unit but an apparatus in the class of ordinary printing presses will suffice to produce replicas in large quantities; hence, in comparison with the conventional methods such as exposure to electron beams, there is achieved a marked improvement in throughput whereas the manufacturing cost is significantly reduced.

When a thermoplastic resin is used as a resist material in the nanoimprint lithographic (NIL) technology, transfer is performed with the thermoplastic resin being heated under pressure to a temperature near its glass transition temperature (Tg) or higher. This approach is called a heat transfer technique and described in Non-Patent Document 2. The heat transfer technique has the advantage of permitting the use of general-purpose, thermoplastic resins. If a photosensitive resin is used as a resist in the NIL technology, a photocurable resin that hardens upon exposure to light such as UV radiation is chosen as the resin to which the original fine pattern is transferred. This approach is called an optical transfer technique and described in Non-Patent Document 3.

In the nanoimprint processing technology using the optical transfer technique, a special photocurable resin must be used but, on the other hand, it has the advantage of reducing the dimensional errors in finished products due to the thermal expansion of transfer printing plates or printing media. Other advantages that are related to the apparatus include elimination of the need for equipping it with a heating mechanism and providing accessories such as for performing temperature elevation, temperature control, and cooling. There is a further advantage concerning the nanoimprint apparatus taken as a whole and that is elimination of the need for design considerations against thermal distortions, such as heat insulation.

An example of nanoimprint apparatuses based on the optical transfer technique is described in Non-Patent Document 3, ibid. This apparatus is so designed that a quartz or sapphire mold (master) capable of transmitting UV light is urged against a photocurable resin coated transfer substrate and irradiated with UV light from above. However, the patterned structure on the rigid quartz or sapphire mold is known to be easily damaged if the mold is pressed into contact with a rigid transfer substrate.

In order to realize uniform and flawless transfer, the fine structure formed in a surface of the stamper need be brought into intimate contact with a surface of the transfer substrate. However, if the transfer substrate itself has a warpage or if a foreign object gets seated between the rigid mold and the transfer substrate or in the presence of any irregular protrusions on the surface of the transfer substrate, a gap or gaps may sometimes occur between the rigid mold and the transfer substrate to inhibit them from having intimate contact with each other. As a result, when a pattern is formed in the photocurable resin, the thickness of the base layer is greater than it should be by an amount that corresponds to the created gap or gaps. The thick base layer cannot be etched away, which eventually becomes a major cause of a poorly etched final product.

With a view to solving these problems, Patent Document 1 proposed that a polymer stamp, or a polymeric material to which the pattern on a rigid mold has been transferred, should be substituted for the rigid mold as a secondary replica. Since the polymer stamp is soft and resilient, it can be pressed with great force into contact with a rigid transfer substrate, with only a small likelihood for the occurrence of unwanted accidents such as nicking of the pattern in the stamp; what is more, the entire surface of the stamp except in the areas where the protrusions or foreign objects occur makes intimate contact with the transfer substrate, so the thickness of the base film becomes thin enough to permit its removal by etching. In addition, given the rigid mold which serves as a master, as many polymer stamps as are required can be produced, so the polymer stamps themselves can be manufactured at such a low cost that a single stamper may be used a plurality of times to cut the print cost or, alternatively, it may be discarded after being used once or several times.

FIG. 13 is an illustration that shows diagrammatically an imprint process that is carried out with a nanoimprint stamper using an example of the polymer stamp proposed in Patent Document 1, ibid. In FIG. 13, the numeral 100 designates a stamper with a hard backup according to the conventional technique. A backup plate 102 is a thick-walled, transparent glass plate. A transparent polymer stamp 106 having a patterned layer 104 on its surface is held on a transparent stamper base 110 with a transparent multi-layered resilient layer 108 being interposed. A transfer substrate 112 is placed on the topside of a substrate platform 114. For the sake of clarity, the warpage of the transfer substrate 112 and the protrusions 116 on the substrate surface are exaggerated.

The polymer stamp 106 is typically formed of a transparent polyester resin with a thickness of 0.5 to 5 µm and a Young's modulus of 2 to 3 GPa. The stamper base 110 is a transparent glass or plastic material with a thickness of about 2 mm. The multi-layered resilient layer 108 is typically formed of a polyurethane rubber, a silicone rubber or an acrylic rubber and the number of layers that compose it generally ranges from about 4 to 6. The presence of this multi-layered resilient layer 108 made of the multi-layered resilient body has enabled the polymer stamp 106 to conform to the warpage of the substrate 112 or any protrusions or invading foreign objects 116 on the substrate surface.

However, in the case where the stamper 100 is designed to have a resilient structure so that it conforms to the warpage of the substrate 112 or protrusions or foreign objects 116 on the substrate surface, if the stamper 100 is rendered soft enough to conform to protrusions or foreign objects 116 of shorter wavelength, "waviness" of longer wavelength is generated and the stamper 100 becomes less capable of conforming to the warpage of the substrate; on the other hand, if the stamper's ability to conform to the warpage of the substrate is enhanced, it becomes less capable of conforming to the protrusions or foreign objects; thus, it has been difficult in the prior art to ensure that the warpage of the substrate and the protrusions or foreign objects on its surface that differ greatly in the wavelength of their shape variation can be coped with simultaneously.

SUMMARY OF INVENTION

Technical Problem

An object, therefore, of the present invention is to provide a nanoimprint stamper with a novel structure that can simultaneously conform to two types of anomaly in the shape of a transfer substrate, i.e., a warpage and surface protrusions (including foreign objects) that differ greatly in the wavelength of variation, and which is capable of performing transfer with a smaller number of defects and in a uniform way.

Another object of the present invention is to provide a fine-structure transfer apparatus (nanoimprint apparatus) using the above-described nanoimprint stamper.

Solution to Problem

The aforementioned first problem can be solved by a nanoimprint stamper comprising a light-transmitting rigid substrate, a light-transmitting resilient plate, a light-transmitting and flexible rigid stamper base, a light-transmitting stamper buffer layer, and a light-transmitting patterned stamp layer, the stamper buffer layer having a lower Young's modulus than the patterned stamp layer.

The aforementioned second problem can be solved by using the nanoimprint stamper of the present invention as a mold in a fine-structure transfer apparatus.

In an embodiment of the nanoimprint stamper of the present invention: the light-transmitting rigid substrate is made of a material selected from the group consisting of a glass plate, a quartz plate and a plastic plate and has a thickness in the range of 10 mm to 30 mm; the light-transmitting resilient plate is made of a material selected from the group consisting of a urethane rubber and a silicone lubber and has a thickness in the range of 3 mm to 15 mm; the light-transmitting and flexible rigid stamper base is made of a material selected from the group consisting of glass, quartz, sapphire, acrylic resins, and rigid polyvinyl chloride and has a thickness in the range of 0.1 mm to 1.0 mm; the light-transmitting stamper buffer layer is made of a material selected from the group consisting of acrylic resins, polyurethane rubber and silicone rubber and has a thickness in the range of 10 µm to 150 µm and a Young's modulus in the range of 1 MPa to 100 MPa; and the light-transmitting patterned stamp layer is made of a material selected from the group consisting of polyester resins and acrylic resins and has a Young's modulus in the range of 1 GPa to 5 GPa and a thickness in the range of 0.1 µm to 10 µm.

In another embodiment of the nanoimprint stamper of the present invention, the light-transmitting rigid substrate, the light-transmitting resilient plate, the light-transmitting and flexible rigid stamper base, the light-transmitting stamper buffer layer, and the light-transmitting patterned stamp layer are combined to form an integral unit.

In still another embodiment of the nanoimprint stamper of the present invention, a first member comprising the light-transmitting rigid substrate and the light-transmitting resilient plate and a second member comprising the light-transmitting and flexible rigid stamper base, the light-transmitting stamper buffer layer and the light-transmitting patterned stamp layer are constructed to be separable from each other, the second member being provided detachable from the first member.

In the foregoing embodiment, the second member may be provided detachable from the first member by a vacuum adsorption means.

The vacuum adsorption means may be an annular groove provided in the lower surface of the light-transmitting resilient plate and the inside diameter of the annular groove is preferably greater than the light-transmitting patterned stamp layer.

If desired, the vacuum adsorption means may be a spiral groove provided in the lower surface of the light-transmitting resilient plate and the inside diameter of the outermost circle of the spiral is preferably greater than the outside diameter of the light-transmitting patterned stamp layer.

In still another embodiment of the nanoimprint stamper of the present invention, the light-transmitting patterned stamp layer has a release treated film deposited on its outer surface.

ADVANTAGEOUS EFFECTS OF INVENTION

The nanoimprint stamper of the present invention is such that in order to conform to a warpage of the transfer substrate, the stamper base comprising a light-transmitting, flexible and rigid thin plate deforms while, at the same time, the resilient plate also deforms so that the stamper as an integral whole conforms to the warped substrate; on the other hand, any protrusions or foreign objects on the substrate surface can be conformed to by means of deformation in the stamper buffer layer which is softer than the patterned stamp layer. Since the capability of conforming to the warpage of the transfer substrate is thusly isolated from the capability of conforming to protrusions or foreign objects on the substrate surface, mechanical conditions for coping with the two types of anomaly in the shape of the transfer substrate can be established independently of each other. As a result, it has become possible to optimize those conditions so that uniform transfer can be realized despite the warpage of the transfer substrate and the protrusions or foreign objects on the substrate surface.

Another feature of the nanoimprint stamper of the present invention is that its stamper buffer layer is also thin, so compared to the conventional nanoimprint stamper which uses a multi-layered resilient body, the occurrence of an in-plane deformation in the bulk of the buffer layer can be suppressed. As a result, the fine structure of the patterned stamp layer will experience small positional offsets and small rates of dimensional changes in the process of pressing the stamper and this contributes not only to a higher precision in transfer but also to an extended service life of the fine structure of the patterned stamp layer.

DESCRIPTION OF EMBODIMENTS

Figure 1:
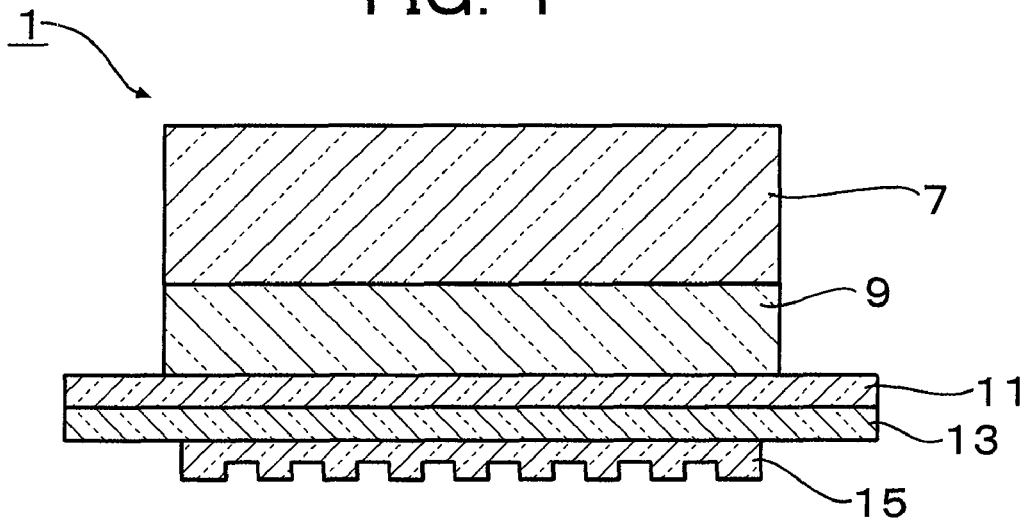
FIG. 1 is a diagrammatic sectional view showing an inseparable monolithic stamper as an embodiment of the nanoimprint stamper according to the first aspect of the present invention.

FIG. 1 is a diagrammatic sectional view showing an embodiment of the nanoimprint stamper according to the first aspect of the present invention. The nanoimprint stamper of the present invention which is generally indicated by 1 comprises basically a light-transmitting rigid substrate 7, a light-transmitting resilient plate 9, a light-transmitting and flexible rigid stamper base 11, a light-transmitting stamper buffer layer 13, and a light-transmitting patterned stamp layer 15. The light-transmitting rigid substrate 7 and the light-transmitting resilient plate 9 together serve as a so-called backup plate. In the embodiment shown in FIG. 1, the light-transmitting rigid substrate 7, the light-transmitting resilient plate 9, the light-transmitting and flexible rigid stamper base 11, the light-transmitting stamper buffer layer 13, and the light-transmitting patterned stamp layer 15 are combined to make an integral unit.

The nanoimprint stamper 1 of the present invention is characterized as follows: in order to conform to a warpage of the transfer substrate (not shown), the stamper base composed of a light-transmitting, flexible and rigid thin plate deforms while, at the same time, the resilient plate also deforms so that the stamper as an integral whole conforms to the warped substrate; on the other hand, any protrusions or foreign objects on the substrate surface can be conformed to by means of deformation in the stamper buffer layer which is softer than the patterned stamp layer. Since the mechanism behind the capability of conforming to the warpage of the transfer substrate is thusly isolated from the mechanism behind the capability of conforming to protrusions or foreign objects on the substrate surface, mechanical conditions for coping with the two types of anomaly in the shape of the transfer substrate can be established independently of each other and, hence, it becomes possible to optimize those conditions so that uniform transfer can be realized by simultaneously coping with the warpage of the transfer substrate and the protrusions or foreign objects on the substrate surface.

Figure 2:
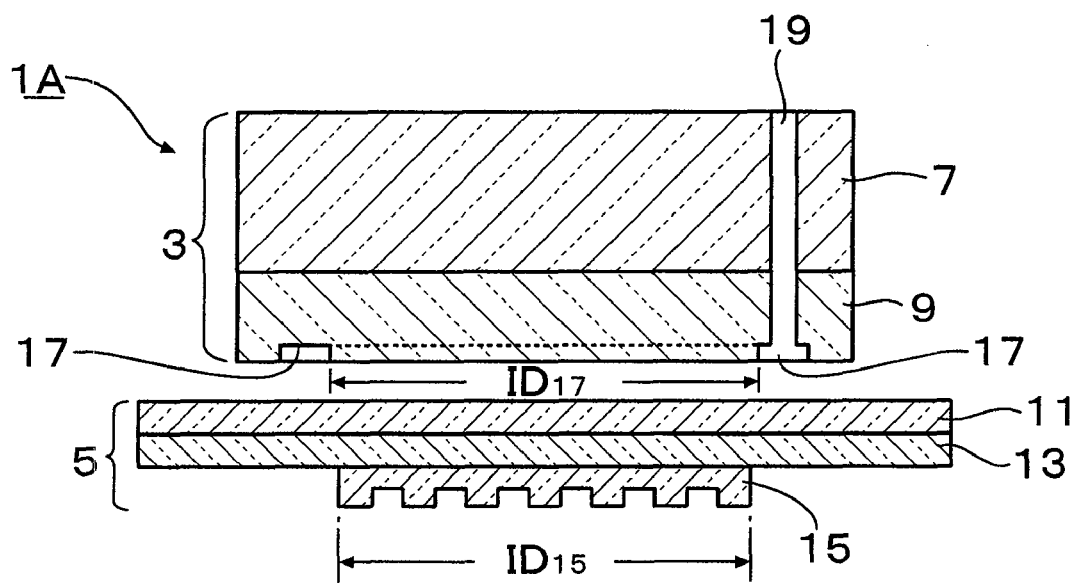
FIG. 2 is a diagrammatic sectional view showing a separable stamper as another embodiment of the nanoimprint stamper of the present invention.

The patterned stamp layer 15 need be changed in accordance with the type of the nanoimprint process to be performed. Hence, in another embodiment of the present invention which is shown in FIG. 2, a nanoimprint stamper generally indicated by 1A is so constructed that it can be separated into two constituent members, a first member 3 comprising the light-transmitting rigid substrate 7 and the light-transmitting resilient plate 9 and a second member 5 comprising the light-transmitting and flexible rigid stamper base 11, the light-transmitting stamper buffer layer 13, and the light-transmitting patterned stamp layer 15. In this embodiment, the second member 5 can be replaced by causing it to be vacuum adsorbed on the first member 3. To this end, an adsorption means 17 for vacuum adsorbing the second member 5 is provided in the lower surface of the resilient plate 9 and this adsorption means 17 communicates with a suitable exhaust channel 19. Although not shown, an end of the exhaust channel 19 is connected to a suitable evacuating means (e.g. a vacuum pump).

Figure 3:
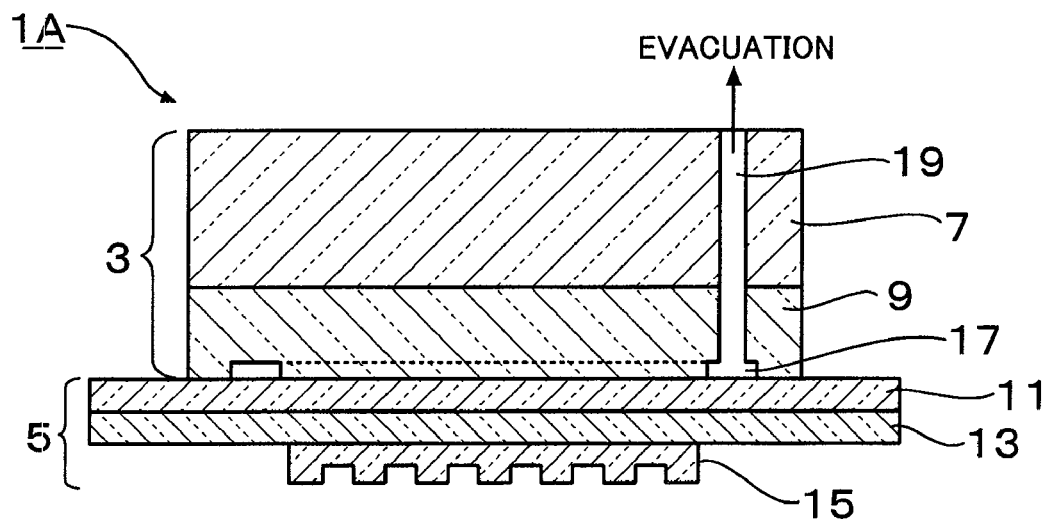
FIG. 3 is a diagrammatic sectional view showing how the two separate members of the separable stamper depicted in FIG. 2 have been joined by vacuum adsorption.

FIG. 3 is a diagrammatic sectional view showing how the second member 5 has been joined to the first member 3 by vacuum adsorption. By interrupting the process of vacuum adsorption, the second member 5 and the first member 3 can be easily separated at any required time, as shown in FIG. 2. Thus, in the nanoimprint stamper 1 of the present invention, the second member 5 can be replaced as required and with extreme ease and, eventually, the patterned stamp layer 15 can be changed in a simple way. To be more specific, by prefabricating many types of the second member 5 having different kinds of the patterned stamp layer 15, each specific need can be easily met. In addition, the second member 5 with a worn patterned stamp layer 15 can be easily replaced by a virgin product. Since the first member 3 is shared by the plurality of second members 5, it suffices to be one in number and, as a result, the overall cost of the stamper can be reduced.

Figure 14A:
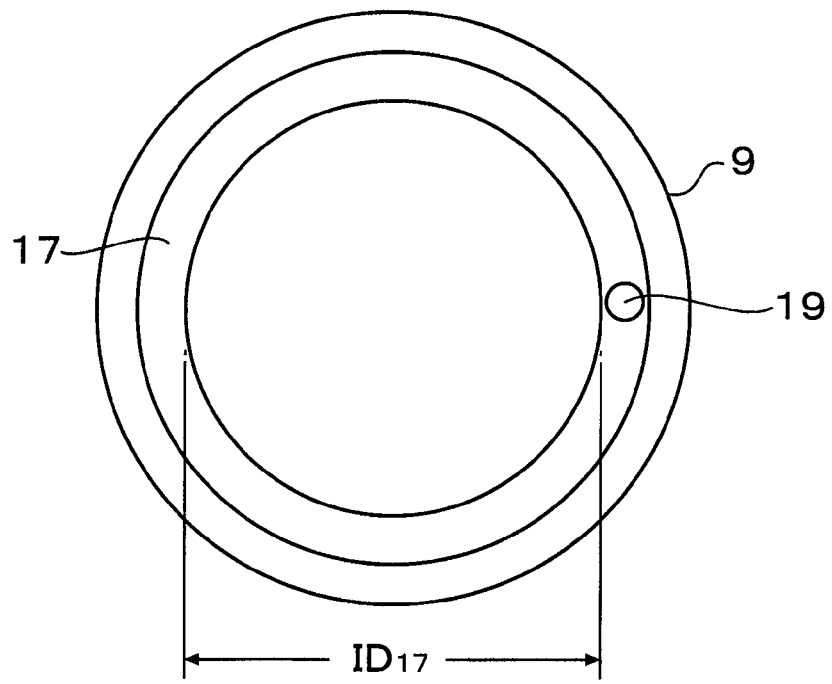
FIG. 14A is a bottom view of the first member 3, as depicted in FIG. 2, which shows a vacuum adsorption means 17 comprising an annular groove provided in the lower surface of a light-transmitting resilient plate 9.

The vacuum adsorption means 17 can typically be an annular groove, as shown in FIG. 14A. In this case, the inside diameter of the ring ($ID_{17}$) is preferably greater than the outside diameter of the light-transmitting patterned stamp layer 15 ($OD_{15}$), as shown in FIG. 2. If the inside diameter of the ring ($ID_{17}$) is smaller than the outside diameter of the light-transmitting patterned stamp layer 15 ($OD_{15}$), those areas of the light-transmitting patterned stamp layer 15 which are closer to the outer peripheral edge of light-transmitting patterned stamp layer 15 may potentially deform in an irregular way when the second member 5 is pressed by the first member 3. If the inside diameter of the annular vacuum adsorption means 17 ($ID_{17}$) is greater than the outside diameter of the light-transmitting patterned stamp layer 15 ($OD_{15}$), there is another advantage in that the rays of exposing ultraviolet light as applied from above are less subject to interference, scattering or other disturbances by the annular vacuum adsorption means 17, with the result that the curing of the resist will not be adversely affected.

Figure 14B:
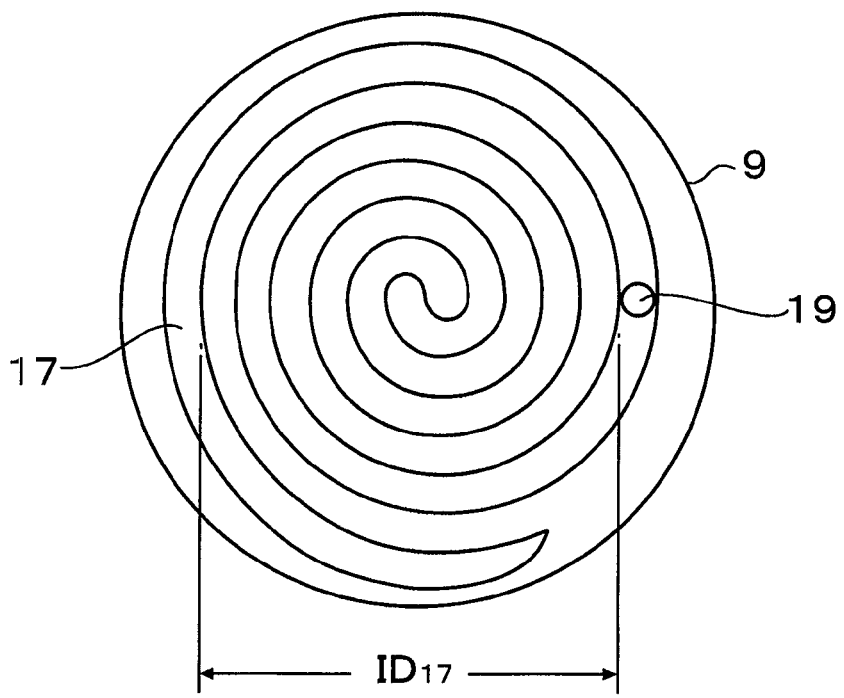
FIG. 14B is a bottom view of the same first member which shows a vacuum adsorption means 17 comprising a spiral groove provided in the lower surface of the light-transmitting resilient plate 9.

Alternatively, the vacuum adsorption means 17 may be a spiral groove, as shown in FIG. 14B. In this case, the rays of exposing ultraviolet light as applied from above may somewhat be interfered with, scattered or otherwise disturbed by the spiral vacuum adsorption means 17; nevertheless, in the case of the spiral groove, not only is it possible to secure a larger area of adsorption but at the same time the force of adsorption can be distributed uniformly, enabling the second member to be vacuum adsorbed without causing any local irregular deformation in the stamper base of the second member. As in the aforementioned case of the annular groove, the inside diameter of the outermost circle of the spiral ($ID_{17}$) is preferably greater than the outside diameter of the light-transmitting patterned stamp layer 15 ($OD_{15}$). Needless to say, adsorption means of other shapes (e.g. a dish) can also be used.

The light-transmitting rigid substrate 7 is a comparatively thick, transparent glass plate, quartz plate or plastic plate (e.g., an acrylic resin plate or a rigid polyvinyl chloride plate) in a thickness of about 10 mm to 30 mm. If the thickness of the light-transmitting rigid substrate 7 is less than 10 mm, its mechanical strength is insufficient that when the stamper 1 or 1A is pressed down from above, it might break or suffer some other unexpected accident. If the thickness of the light-transmitting rigid substrate 7 exceeds 30 mm, it has the necessary sufficient mechanical strength but, on the other hand, its light transmittance decreases, which is certainly undesirable.

The resilient plate 9 is a comparatively thick, transparent rubber member in a thickness of about 3 mm to 15 mm. The transparent rubber member that can be used in the nanoimprint stamper 1 of the present invention may be exemplified by a urethane rubber or a silicone rubber. If the thickness of the resilient plate 9 is less than 3 mm, it is incapable of deforming the stamper base 11. On the other hand, if the thickness of the resilient plate 9 exceeds 15 mm, an excessive lateral offset might occur to cause a transfer offset.

The light-transmitting rigid substrate 7 and the resilient plate 9 may be joined together into an integral unit by means of an adhesive agent or by vacuum adsorption and the like. Exemplary adhesive agents that can be used include optical adhesives based on acrylic rubbers and UV curable polyester resins. Each of these adhesives can transmit light. Alternatively, the resilient plate 9 may be mechanically clamped to the light-transmitting rigid substrate 7 so that they form an integral unit. For example, the resilient plate 9 and the light-transmitting rigid substrate 7 may be fixed together by means of a ring-shaped clamp that is applied to the outer periphery of each member. If desired, vacuum adsorption may be combined with the mechanical fixing means.

The stamper base 11 is used to ensure that the nanoimprint stamper 1 of the present invention can conform to any warpage in the transfer substrate. Hence, the stamper base 11 is a flexible rigid thin plate that is formed of a light-transmitting material. Exemplary materials that can be used include glass, quartz, sapphire, and transparent plastics (e.g., acrylic resins, rigid polyvinyl chloride, etc.) A glass plate is preferred from the viewpoints of light transmission and cost. The thinner the stamper base 11 is, the more easily it can deform, with the result that it can conform to the warpage of the transfer substrate in an easy and positive manner. The thickness of the stamper base 11 is within the range of 0.1 mm to 1.0 mm. If the thickness of the stamper base 11 is less than 0.1 mm, it is so flexible that it can deform sufficiently to conform to the warpage of the transfer substrate but, on the other hand, it is so thin that it is difficult to handle. If the thickness of the stamper base 11 exceeds 1.0 mm, it is satisfactorily easy to handle but, on the other hand, it has no flexibility and can only deform by an insufficient degree to conform to the warpage of the transfer substrate.

The stamper buffer layer 13 is used to ensure that the nanoimprint stamper 1 of the present invention can conform to any protrusions or foreign objects that may be present on a surface of the transfer substrate. The stamper buffer layer 13 is typically formed of a transparent acrylic resin, polyurethane rubber, silicone rubber, or the like. The thickness of the stamper buffer layer 13 is within the range of 10 μm to 150 μm. If the thickness of the stamper buffer layer 13 is less than 10 μm, the nanoimprint stamper 1 of the present invention may potentially fail to conform to protrusions or foreign objects on a surface of the transfer substrate that are higher than 10 μm. On the other hand, if the thickness of the stamper buffer layer 13 exceeds 150 μm, it is unduly thick compared to the height of the protrusions or foreign objects, potentially causing positional offsets or great rates of dimensional changes in the fine-structure pattern of the patterned stamp layer in the process of pressing the stamper. As already mentioned, the stamper buffer layer 13 is used to ensure that the nanoimprint stamper 1 of the present invention can conform to any protrusions or foreign objects that may be present on a surface of the transfer substrate, so the stamper buffer layer 13 must be softer than the patterned stamp layer 15 to be described below. To meet this requirement, the Young's modulus of the stamper buffer layer 13 is within the range of 1 MPa to 100 MPa. If its Young's modulus is less than 1 MPa, the stamper buffer layer 13 is so soft that the nanoimprint stamper 1 of the present invention might fail to conform to the protrusions or foreign objects. On the other hand, if its Young's modulus exceeds 100 MPa, the stamper buffer layer 13 is so rigid that the nanoimprint stamper 1 of the present invention might again fail to conform to the protrusions or foreign objects.

The patterned stamp layer 15 must be formed of a light-transmitting material. The material to form the patterned stamp layer 15 may be exemplified by polyester resins or acrylic resins. Ultraviolet (UV) curable polyester resins are particularly preferred since they have outstanding release properties. However, the patterned stamp layer 15 need not be as soft and resilient as the stamper buffer layer 13. Its softness and resilience suffice to be of such degrees that even if some protrusions or foreign objects exist between the nanoimprint stamper 1 and the transfer substrate (not shown), it is capable of sufficient flexural deformation to accommodate or conform to those protrusions or foreign objects. The Young's modulus of the patterned stamp layer 15 is within the range of 1 GPa to 5 GPa. If its Young's modulus is less than 1 GPa, the patterned stamp layer 15 is so soft that the fine-structure pattern may potentially buckle under the force being exerted in the process of pressing the stamper, causing the inconvenience of difficulty in the nanoimprint processing. On the other hand, if the Young's modulus of the patterned stamp layer 15 exceeds 5 GPa, it is so hard as to cause the inconvenience of difficulty in deforming to conform to the protrusions or foreign objects on the substrate surface. As already mentioned, the stamper buffer layer 13 is softer than the patterned stamp layer 15, so a deformation of the patterned stamp layer 15 will be absorbed by the stamper buffer layer 13 which also deforms, eventually ensuring that the nanoimprint stamper 1 can satisfactorily conform to the protrusions or foreign objects on a surface of the transfer substrate. It should also be mentioned that the thickness of the patterned stamp layer 15 is generally within the range of 0.1 µm to 10 µm. If the thickness of the patterned stamp layer 15 is less than 0.1 µm, the amount of the resin coat as applied to form the resin pattern is so small that pattern defects are likely to occur. On the other hand, if the thickness of the patterned stamp layer 15 exceeds 10 µm, it deforms only with difficulty to conform to the protrusions or foreign objects on a surface of the transfer substrate.

The stamper base 11, the stamper buffer layer 13 and the patterned stamp layer 15 are by themselves sticky to each other, so they can be easily combined into an integral unit without taking any special means. For example, a material capable of forming the stamper buffer layer 13 may be spin coated on a surface of the stamper base 11; alternatively, a mold may be used to make an integral unit. However, if desired, they may be formed into an integral unit by means of a suitable adhesive agent or the like. Exemplary adhesives that can be used include optical adhesives based on acrylic rubbers and UV curable polyester resins. Each of these resins can transmit light.

Figure 4:
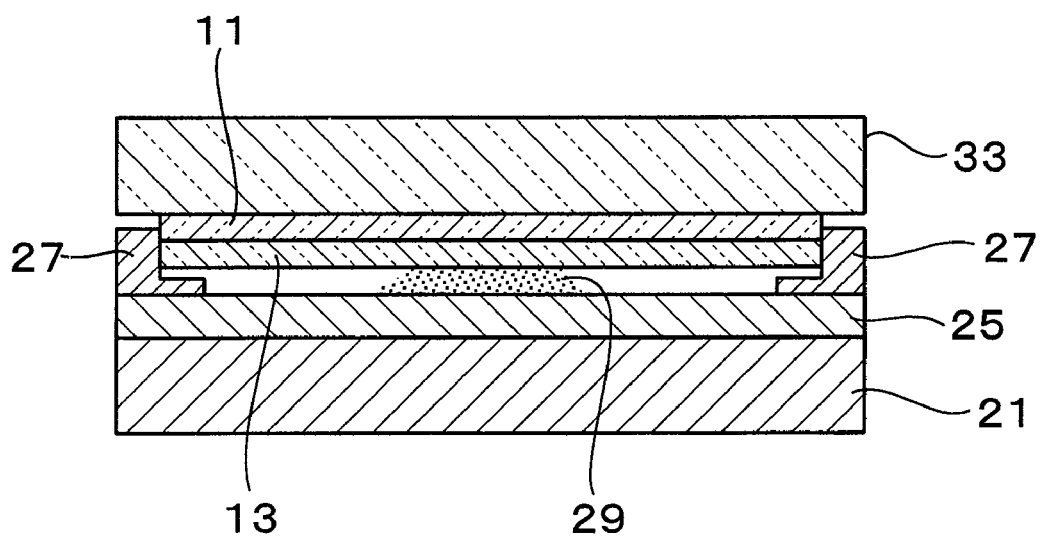
FIG. 4 is a diagrammatic view showing an exemplary processing method for forming a patterned stamp layer 15 on the underside of a stamper buffer layer 13.

FIG. 4 is a diagrammatic view showing an exemplary processing method for forming the patterned stamp layer 15 on the underside of the stamper buffer layer 13. A master 25 is placed on the topside of a lower planar plate 21 and an alignment plate 27 is placed on the topside of the master 25. A suitable amount of a photocurable resin 29 for forming the patterned stamp layer 15 is applied to the topside of the master 25. The photocurable resin 29 may be applied by any conventional method such as a dispensing technique or a spin coating technique. In the dispensing technique, a drop of the photocurable resin 29 is deposited on a surface of the master 25. After the resin is applied, an upper planar plate 33 holding a laminate of the stamper base 11 and the stamper buffer layer 13 is allowed to descend gently for alignment. After the end of alignment step, a predetermined pressure is applied to the upper planar plate 33 so that the stamper buffer layer 13 is pressed into contact with the master 25. In response to the contact the stamper buffer layer 13 makes with the master 25, the deposited drop of the photocurable resin 29 spreads all over the surfaces of the master 25 and the stamper buffer layer 13. Upon further application of pressure, the thickness of the patterned stamp layer 15 being formed can be reduced. With continued pressure application, the assembly is exposed to UV light for a suitable period of time until the resin hardens to form the patterned stamp layer 15 to which the pattern of the master 25 has been transferred. The master 25 can be prepared by any known method that is conventionally employed by skilled artisans. For instance, the master 25 can be prepared by various techniques such as photolithography and exposure with electron beams, X-rays, or ion beams.

Figure 5:
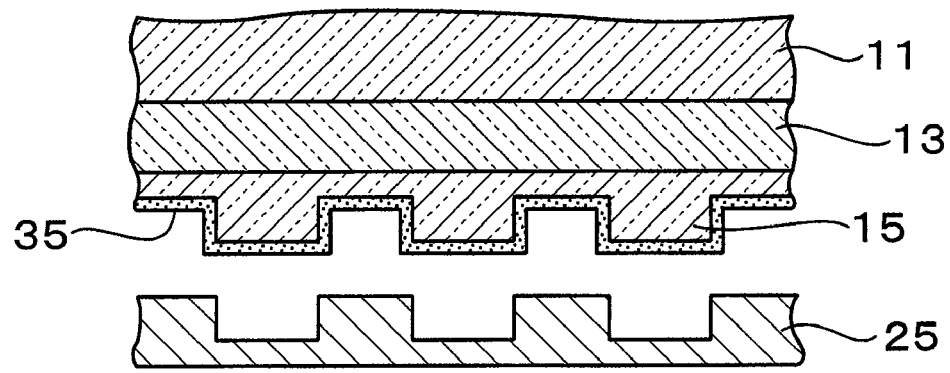
FIG. 5 is a sectional view showing partially enlarged the nanoimprint stamper 1 of the present invention as obtained by the processing scheme shown in FIG. 4.

FIG. 5 is a sectional view showing partially enlarged the nanoimprint stamper 1 of the present invention as obtained by the processing scheme shown in FIG. 4. If the pattern of the master 25 is recessed, the patterned stamp layer 15 has an inverted, embossed pattern. Conversely, if the pattern of the master 25 is embossed, the patterned stamp layer 15 has a recessed pattern. Subsequently, a release treated film 35 may be deposited on the outer surface of the patterned stamp layer 15. The release treated film 35 is anticipated to be effective in facilitating release of the nanoimprint stamper 1 of the present invention from the transfer substrate (not shown). The material to form the release treated film 35 may be exemplified by a fluorine-containing or a silicone-based material. The release treated film 35 may be formed by various methods including, for example, spraying, evaporation, dipping, and brushing. The thickness of the release treated film 35, if it is applied by dipping, is approximately a few nanometers.

Figure 6:
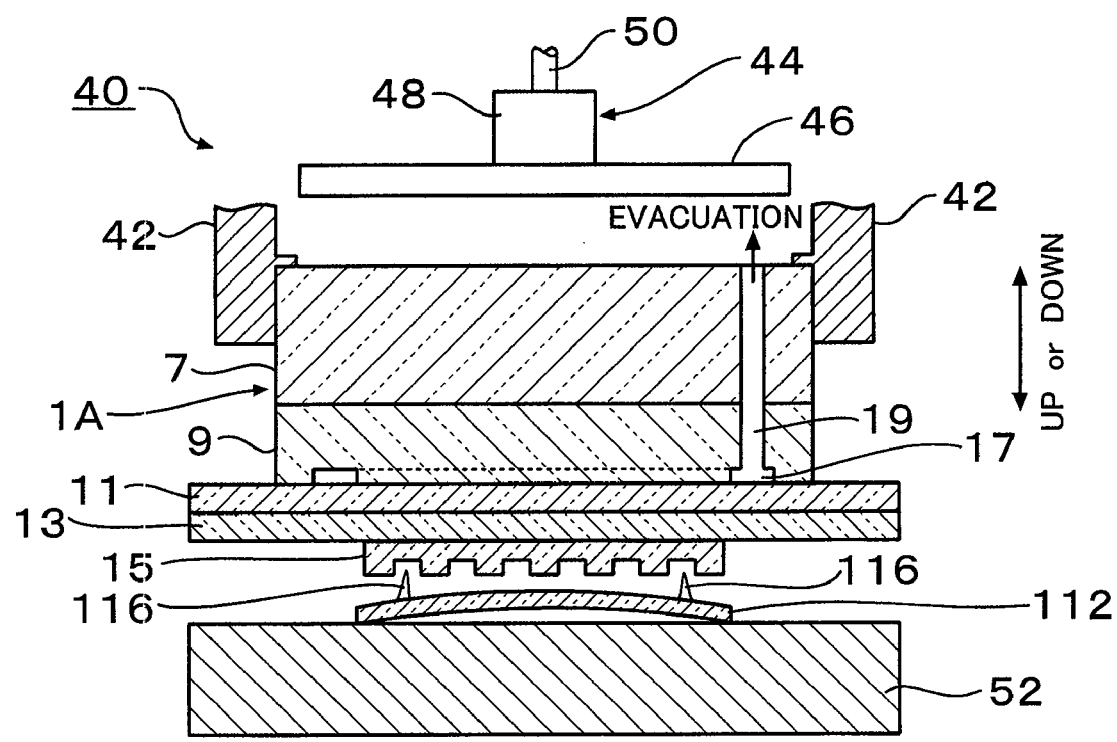
FIG. 6 is a diagrammatic compositional view showing an example of the fine-structure transfer apparatus according to the second aspect of the present invention.

FIG. 6 is a diagrammatic compositional view showing an example of the fine-structure transfer apparatus according to the second aspect of the present invention. In the fine-structure transfer apparatus according to the second aspect of the present invention which is generally indicated by 40 in FIG. 6, the nanoimprint stamper 1A is held to be vertically movable by means of a stamper holding jig 42. If desired, the stamper holding jig 42 may be equipped with an X-Y moving mechanism for alignment of the stamper 1A. An exposure unit 44 is provided on top of the stamper holding jig 42. The exposure unit 44 may be held by the stamper holding jig 42 or, alternatively, the two parts may be arranged independently of each other. The exposure unit 44 comprises an ultraviolet irradiating plate (e.g., a sapphire plate) 46, an irradiating lens 48, and an ultraviolet lightguide means (e.g., an optical fiber) 50.

Further referring to FIG. 6 which shows the fine-structure transfer apparatus 40 according to the second aspect of the present invention, a transfer substrate 112 is placed on the topside of a stage 52. The transfer substrate 112 is identical to the substrate used in the prior art system shown in FIG. 13. Hence, the substrate 112 is shown to have not only a warpage but also protrusions 116. The stage 52 may be formed of any materials including, for example, quartz, sapphire, glass, metals (e.g., stainless steel and aluminum), ceramics and plastic resins (e.g., silicone rubber). The topside of the stage 52 may comprise a flat or curved surface. A stage whose topside comprises a curved surface is described in the specification of commonly assigned Japanese Patent Application No. 2007-295458. Although not shown, the stage 52 may be equipped with a mechanism for chucking the substrate 112, as well as a mechanism for detaching the substrate from the stage. Any known mechanism that is conventionally used by skilled artisans may be employed; an applicable substrate chucking mechanism is a vacuum adsorption mechanism, and an applicable substrate detaching mechanism is a pin ejecting or a pin lift-up mechanism. Instead of providing it on the stamper holding jig 42, the X-Y moving mechanism may be provided on the stage 52 to effect alignment of the transfer substrate 112.

The transfer substrate 112 is a member to which the fine pattern formed in the patterned stamp layer 15 of the nanoimprint stamper 1A is transferred. The material that can be used to make the transfer substrate 112 is selected from among silicone, glass, metals (e.g., aluminum), synthetic resins (e.g., polyester resins and acrylic resins), and so forth. Depending on the need, a metal layer, a resin layer, an oxide layer or the like may be preliminarily formed on a surface of the transfer substrate 112. The transfer substrate 112 may assume any desired shape such as a circle, an oval, a rectangle, or a polygon. A disk substrate in the shape of a doughnut may also be used.

Figure 7:
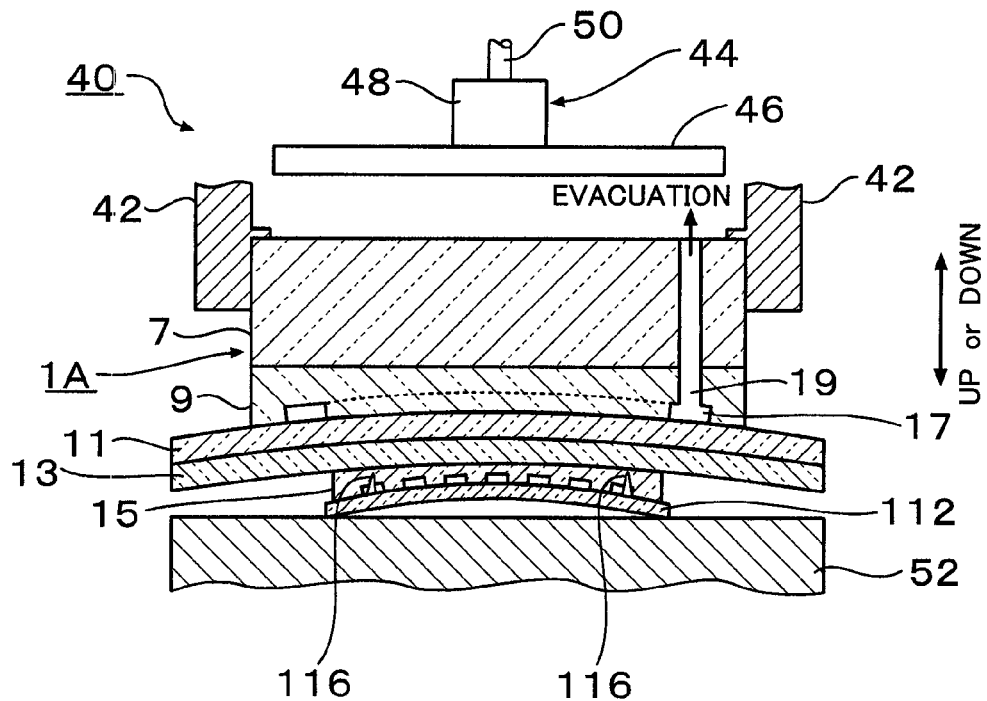
FIG. 7 is a schematic diagrammatic sectional view showing a transfer substrate 112 on a stage 52 as it has been pressed down by a stamper 1A in the fine-structure transfer apparatus depicted in FIG. 6.

FIG. 7 is a schematic diagrammatic sectional view showing the transfer substrate 112 on the stage 52 as it has been pressed down by the stamper 1A in the fine-structure transfer (nanoimprint) apparatus 40 depicted in FIG. 6. Even if the nanoimprint stamper 1A of the present invention is pressed against the substrate 112, the stamper 1A will not by itself eliminate the warpage of the substrate 112 to straighten it out. This is because cracks or other damage will occur in the substrate 112 if a forced attempt is made to straighten it out. When the nanoimprint stamper 1A of the present invention is pressed against the substrate 112, the flexible rigid stamper base 11 bends in accordance with the warpage of the substrate and this flexural deformation of the stamper base 11 is absorbed by the corresponding deformation of the overlying resilient plate 9. Since the rigid substrate 7 overlies the resilient plate 9, the deformation of the resilient plate 9 is interrupted by the rigid substrate 7. Thus, if the nanoimprint stamper 1A of the present invention is used with the warped substrate, the stamper base in the form of a light-transmitting, flexible, rigid thin plate deforms to conform to the warpage and, at the same time, the resilient plate also deforms, whereupon the whole stamper taken as an integral unit copes with the warpage of the substrate. As a result, the fine-structure transfer (nanoimprint) apparatus 40 which uses the nanoimprint stamper 1A of the present invention features an outstanding dimensional precision in transfer. In addition, because of the above-described structure which comprises the combination of the flexible rigid stamper base 11 and the overlying resilient plate 9, the stamper 1A of the present invention can perform the transfer operation even with a lower pressing force and this offers an additional advantage of extending the service life of the patterned stamp layer 15.

Figure 8:
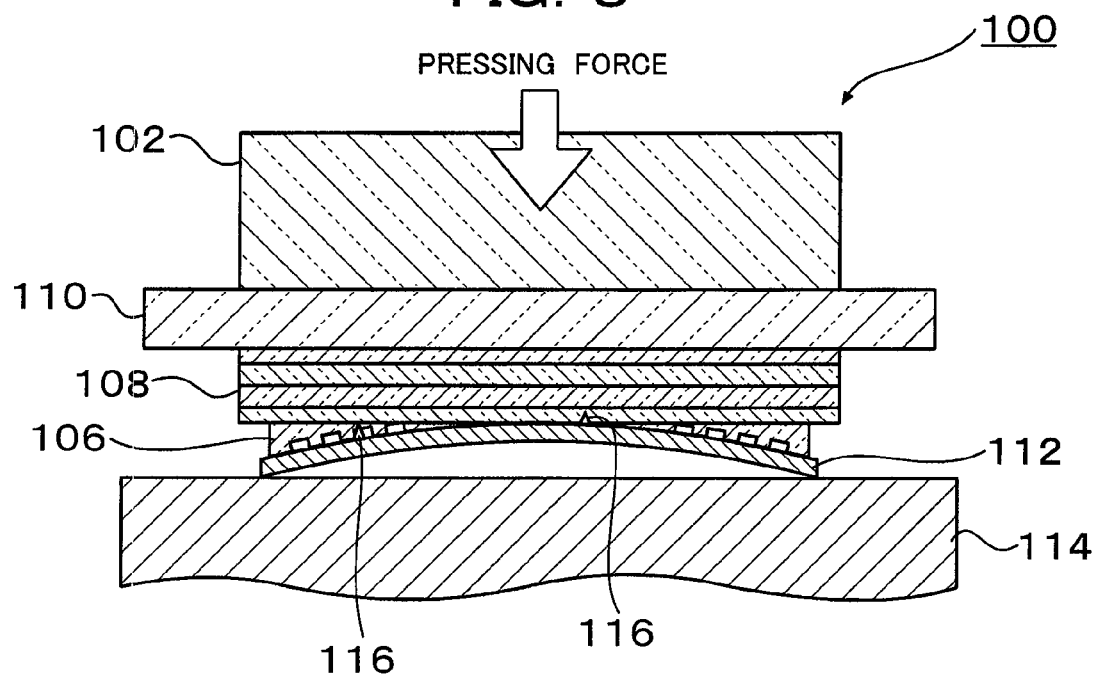
FIG. 8 is a schematic diagrammatic sectional view showing a transfer substrate 112 on a stage 114 as it has been pressed down by a stamper 100 of the prior art that is depicted in FIG. 13.
Figure 13:
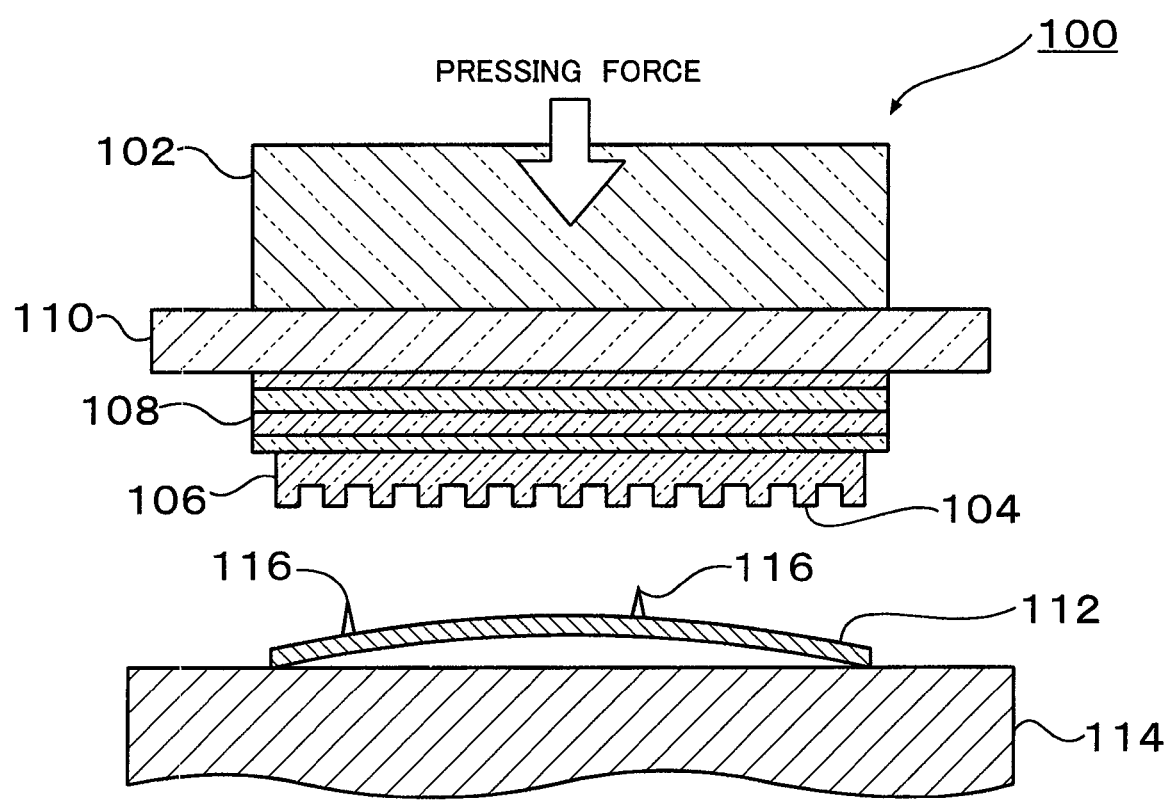
FIG. 13 is a diagrammatic illustration for imprint processing by means of the nanoimprint stamper of the prior art.

In contrast, when the conventional stamper 100 shown in FIG. 13 is pressed against the substrate 112 as shown in FIG. 8, the polymer stamp 106 deforms preferentially to conform to protrusions 116 on the substrate 112 but the multi-layered resilient layer 108 does not conform to the warpage of the substrate 112. Hence, the polymer stamp 106 is highly compressed in an area near the center and, as a result, the patterned layer 104 deforms irregularly to lower the dimensional precision in transfer. In addition, if an attempt is made to have the multi-layered resilient layer 108 conform to the warpage of the substrate 112, more than twice the force to press the stamper 1 or 1A of the present invention is required, causing the disadvantage of shortening the service life of the patterned layer 104 in the polymer stamp 106.

Applied to the topside of the transfer substrate 112 are spots of a photocurable resin 54 (see FIG. 9) that serves as the material to form a patterned nanoimprint layer 56 to be described later (see FIG. 10). Various methods may be used to apply the photocurable resin 54 and they include an ink-jet process, a dispensing process, a spin coating process, and so forth. The ink-jet process is preferred since it provides ease in strictly controlling the coating weight of the photocurable resin 54 and because the latter can be selectively to the areas as are required by the patterned stamp layer 15. The ink-jet process is performed with an ink-jet printer. The timing of applying the photocurable resin 54 to the transfer substrate 112 may be either prior to or after placing the transfer substrate 112 on the stage 52. A composition that can be used as the photocurable resin 54 is a resin material to which a photosensitizer has been added. Exemplary resin materials include polyesters, cycloolefin polymers, poly(methyl methacrylate) (PMMA), polystyrene polycarbonate, polyethylene terephthalate (PET), polylactic acid, polypropylenes, polyethylenes, poly(vinyl alcohol), etc. Exemplary photosensitizers include peroxides, azo compounds, ketones, diaminobenzene, metallic complex salts, etc. The mixing proportions of the resin material and photosensitizer can be determined as appropriate by skilled artisans.

Figure 9:
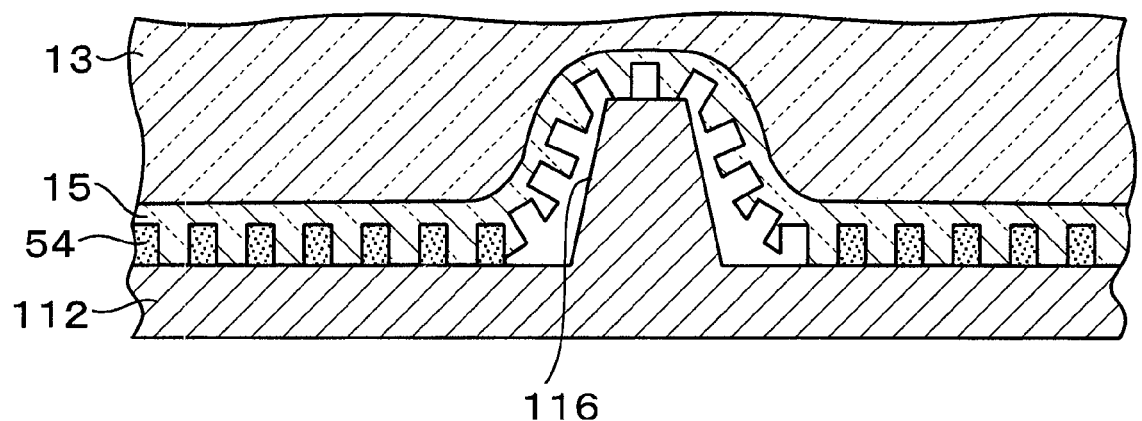
FIG. 9 is a diagrammatic sectional view showing partially enlarged the result of transfer as performed by the fine-structure transfer apparatus according to the second aspect of the present invention which is generally indicated by 40 in FIG. 6.

FIG. 9 is a diagrammatic sectional view showing partially enlarged the result of transfer as performed by the fine-structure transfer apparatus 40 of the present invention which is depicted in FIG. 6. The patterned stamp layer 15 of the stamper 1 is held pressed against the coat of photocurable resin 54 that has been applied to a surface of the transfer substrate 112. If a protrusion 116 is present on the surface of the transfer substrate 112, the patterned stamp layer 15 deforms to extend along the outer peripheral surface of the protrusion 116 and this deformation is absorbed by the corresponding deformation of the overlying stamper buffer layer 13 of low Young's modulus. Hence, the width of deformation in the patterned stamp layer 15 is localized around the protrusion 116. For the sake of convenience in explanation, the protrusion 116 is shown to be trapezoidal but, needless to say, this is not the only shape that can be assumed by the protrusion 116. Particularly in the case of foreign objects, they are not all limited in such terms as shape, size, and height.

Figure 10:
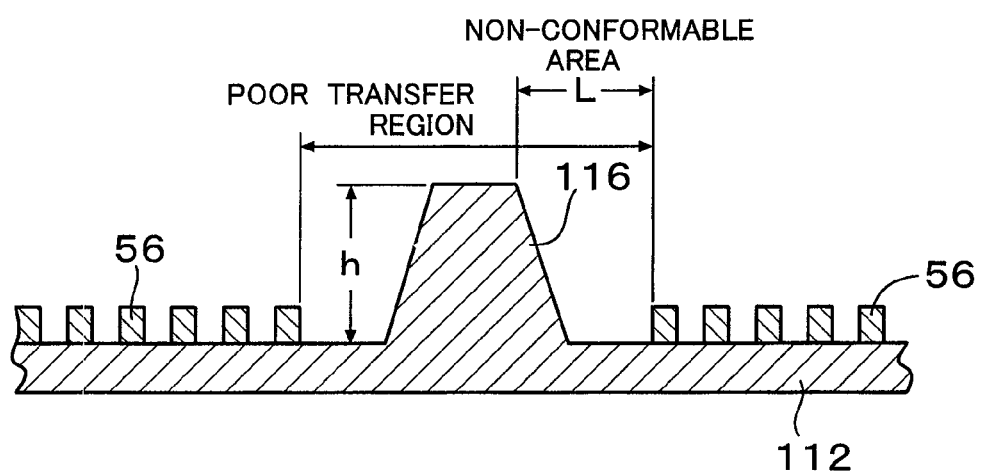
FIG. 10 is a diagrammatic sectional view showing partially enlarged the state of a surface of the transfer substrate 112 after the process of transfer with a photocurable resin 54 having been hardened by exposure to light.

FIG. 10 is a diagrammatic sectional view showing partially enlarged the state of a surface of the transfer substrate 112 after the process of transfer with the photocurable resin 54 having been hardened by exposure to light. The features of a patterned nanoimprint layer 56 are formed orderly on the substrate surface but no such patterned nanoimprint layer is formed around the protrusion 116. By using the stamper 1 of the present invention, that region of the substrate 112 which is around the protrusion 115 and where only poor transfer is realized can be minimized. In addition, the length of non-conformable area (L) which is the distance from an edge of the top of the protrusion 116 to the first feature of the patterned nanoimprint layer 56, as divided by the height (h) of the protrusion 116 above the topside of the substrate 112 can be used as an index for evaluating the ability of the stamper to conform to the projection on the substrate. The smaller the value of L/h, the more effectively the stamper can conform to the protrusion on the substrate.

Figure 11:
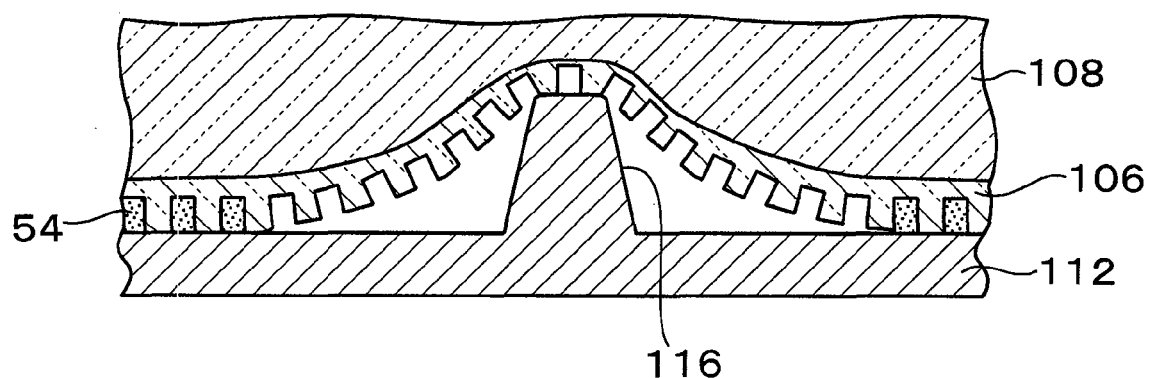
FIG. 11 is a diagrammatic sectional view showing partially enlarged the result of transfer as performed by the nanoimprint stamper of the prior art that is depicted in FIG. 13.
Figure 12:
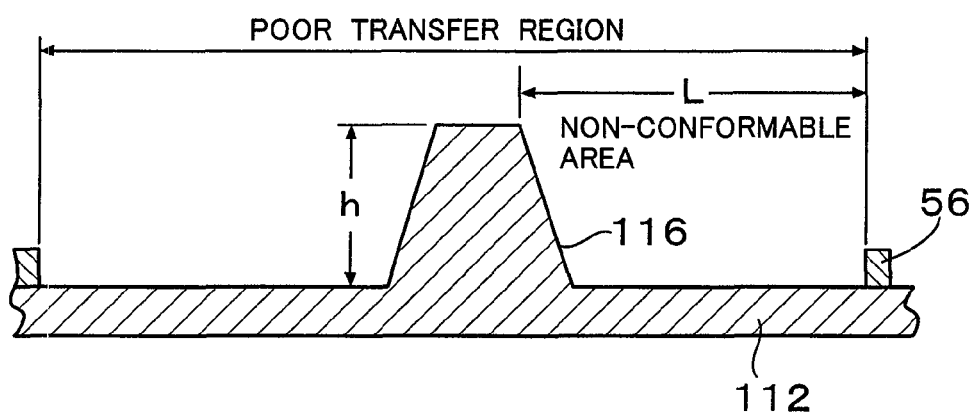
FIG. 12 is a diagrammatic sectional view showing partially enlarged the state of a surface of the transfer substrate 112 in FIG. 11 after the process of transfer with the photocurable resin 54 having been hardened by exposure to light.

FIG. 11 is a diagrammatic sectional view showing partially enlarged the result of transfer as performed by the conventional nanoimprint stamper 100 that is depicted in FIG. 13 which has the multi-layered resilient layer 108. The protrusion 116 on the substrate 112 causes the polymer stamp 106 to deform but this deformation is not absorbed by a corresponding deformation of the multi-layered resilient layer 108, so a large gap will form around the protrusion 116. Consequently, as shown in FIG. 12, a bigger region of poor transfer appears and the yield of nanoimprint processing decreases. What is more, the value of L/h increases to reduce the ability of the stamper to conform to the protrusion on the substrate.

EXAMPLE 1

On the following pages, the nanoimprint stamper and fine-structure transfer apparatus of the present invention are illustrated in a concrete manner by means of an example that is by no means intended to limit the scope of the present invention. Described in the following example is such an operation that by means of the fine-structure transfer apparatus shown in FIG. 6, the fine pattern in the patterned stamp layer 15 was transferred to the transfer substrate 112 using the vacuum adsorbable nanoimprint stamper 1A shown in FIGS. 2 and 3.

The first member of the nanoimprint stamper 1A consisted of a 20-mm thick glass plate as the light-transmitting rigid substrate 7 and a 10-mm thick urethane rubber sheet as the resilient plate 9. An annular groove for vacuum adsorption was provided in the lower surface of the resilient plate 9 and connected to an external vacuum pump via an exhaust channel. The glass-made rigid plate 7 was held on the ascending/descending mechanism 42.

The second member of the nanoimprint stamper 1A consisted of the stamper base 11, the stamper buffer layer 13, and the patterned stamp layer 15; a 0.7-mm thick glass plate was used as the stamper base 11; the lower surface of the glass plate was coated with an acrylic resin to form the stamper buffer layer 13 in a thickness of about 100 μm; and the stamper buffer layer 13 was underlaid with the patterned stamp layer 15 in a thickness of about 5 μm that was formed of a photocurable polyester resin. The stamper buffer layer 13 had a Young's modulus of 30 MPa and the patterned stamp layer 15 a Young's modulus of 1 GPa. The second member was vacuum adsorbed on the first member. The patterned surface of the patterned stamp layer 15 was coated with a fluorine-containing release agent. The patterned stamp layer 15 had a pattern of 100-nm wide trenches formed in its surface on a pitch of 200 nm to a depth of 150 nm.

In the fine-structure transfer apparatus 40, an epitaxial film fitted sapphire substrate 112 with a thickness of 0.7 mm and a diameter of 100 mm was placed on the stainless steel stage 52 equipped with an X-Y moving mechanism. The sapphire substrate had a warpage that was 100 μm high above the horizontal level at its center, as well as about 100 protrusions not higher than 10 μm. Using a commercial ink-jet printer, the photocurable acrylate resin 54 was applied by an ink-jet process onto the upper surface of the sapphire substrate 112 in a pattern that corresponded to the pattern of the patterned stamp layer 15.

The ascending/descending mechanism 42 was allowed to descend such that the nanoimprint stamper 1A was urged into contact with the sapphire substrate 112 at a pressing force of 0.3 MPa. Thereafter, UV light was applied from an exposure unit 44 to pass through the light-transmitting nanoimprint stamper 1A, whereupon the photocurable acrylate resin 54 on top of the sapphire substrate 112 hardened. The exposure time was 40 seconds. After the resin hardened, the ascending/descending mechanism 42 was allowed to ascend so that the sapphire substrate 112 separated from the nanoimprint stamper 1A. The surface of the sapphire substrate 112 was examined with a scanning electron microscope, showing the presence of a patterned nanoimprint layer 56 (see FIG. 10) comprising 100-nm wide parallel trenches that had been formed in that surface on a pitch of 200 nm to a depth of 150 nm. The nanoimprint stamper 1A was found to be capable of conforming to protrusions on the sapphire substrate with a performance factor (L/h) of 3-8. The rate of dimensional changes that occurred in the patterned layer 56 was no greater than 5 ppm.

COMPARATIVE EXAMPLE 1

In this comparative example, the same substrate as used in Example 1 was subjected to a nanoimprint process using the nanoimprint stamper 100 of the prior art that is shown in FIG. 13. In the nanoimprint stamper 100, the member 102 was a 20-mm thick glass plate, the member 110 was a 1-mm thick glass plate, the member 108 as an intermediate layer was a 1-mm thick multi-layered structure comprising a polyurethane rubber and a polyester resin, and the member 106 was identical to the patterned stamp layer 15 used in the nanoimprint stamper 1A of Example 1. The nanoimprint stamper 100 was urged into contact with the sapphire substrate 112 at a pressing force of 0.6 MPa. Thereafter, UV light was applied from the exposure unit 44 to pass through the light-transmitting nanoimprint stamper 100, whereupon the photocurable acrylate resin 54 on top of the sapphire substrate 112 hardened. The exposure time was 40 seconds. After the resin hardened, the ascending/descending mechanism 42 was allowed to ascend so that the sapphire substrate 112 separated from the nanoimprint stamper 100. The surface of the sapphire substrate 112 was examined with a scanning electron microscope, showing the presence of a patterned nanoimprint layer 56 comprising 100-nm wide parallel trenches that had been formed in that surface on a pitch of 200 nm to a depth of 150 nm. However, the nanoimprint stamper 100 was only capable of conforming to protrusions on the sapphire substrate with a performance factor (L/h) of 15-30; under the pressing force combined with the intermediate layer 108 that deformed to conform to the warpage of the sapphire substrate, the patterned layer 56 had experienced dimensional changes at rates in the range of 10 to 30 ppm.

INDUSTRIAL APPLICABILITY

On the foregoing pages, the nanoimprint stamper according to the first aspect of the present invention and the fine-structure transfer apparatus according to its second aspect have been described with a focus being put on the UV nanoimprint process; however, the applicability of the nanoimprint stamper and fine-tructure transfer apparatus of the present invention is by no means limited to the UV nanoimprint process and, if desired, they may be applied to the thermal imprint or the soft lithographic process, provided that each of these alternative methods may be modified as required in any suitable way that is known to skilled artisans, as exemplified by providing a heating/cooling means.

The nanoimprint stamper and fine-structure transfer apparatus of the present invention are applicable not only to the fabrication of high-capacity media disks (both magnetic and optical), semiconductors and ultrahigh-density printed wiring boards, but also to the manufacture of other devices including biosensors, DNA chips, micro-channel devices, FED/SED, organic ELs, highly functional optical members, solar cell surfacing members, nano-lens arrays, optical ICs, optical devices, optical interconnections, and organic semiconductors.

REFERENCE SIGNS LIST 1, 1A: Nanoimprint stamper of the present invention
3: First member
5: Second member 7: Light-transmitting rigid substrate
9: Resilient plate
11: Stamper base
13: Stamper buffer layer
15: Patterned stamp layer
17: Adsorption means
19: Exhaust channel
21: Lower planar plate
25: Master
27: Alignment plate
29: Photocurable resin
33: Upper planar plate
35: Release treated film
42: Ascending/descending mechanism
44: Exposure unit
46: Ultraviolet irradiating plate
48: Irradiating lens
50: Ultraviolet lightguide means
52: Stage
54: Photocurable resin
56: Patterned nanoimprint layer
100: Prior art nanoimprint stamper with hard backup
102: Backup plate
104: Patterned layer
106: Polymer stamp
108: Multi-layered resilient layer
110: Stamper base
112: Transfer substrate
114: Substrate platform
116: Protrusion

CITATION LIST

Patent Literature
(1) JP 2007-55235 A
Non Patent Literature
(1) S. Y. Chou et al., Appl. Phys. Lett., Vol. 67, No. 21, 20 Nov. 1995, pp. 3114-3116
(2) Yoshihiko HIRAI, Nanostructure Fabrication by Nanoimprint Technology, Journal of the Japan Society for Precision Engineering, Vol. 70, No. 10, 2004, pp. 1223-1227
(3) Jun TANIGUCHI et al., Recent trend of nanoimprint technique, Journal of the Society for Abrasive Technology, Vol. 46, No. 6, June 2002, pp. 282-285

The invention claimed is:

1. A nanoimprint stamper comprising a light-transmitting rigid substrate, a light-transmitting resilient plate, a light-transmitting and flexible rigid stamper base, a light-transmitting stamper buffer layer, and a light-transmitting patterned stamp layer, the stamper buffer layer having a lower Young's modulus than the patterned stamp layer,
wherein a first member comprising the light-transmitting rigid substrate and the light-transmitting resilient plate and a second member comprising the light-transmitting and flexible rigid stamper base, the light-transmitting stamper buffer layer and the light-transmitting patterned stamp layer are constructed to be separable from each other, the second member being provided detachable from the first member.

2. The nanoimprint stamper according to claim 1, wherein the light-transmitting rigid substrate is made of a material selected from the group consisting of a glass plate, a quartz plate and a plastic plate and has a thickness in the range of 10mm to 30mm, the light-transmitting resilient plate is made of a material selected from the group consisting of a urethane rubber and a silicone lubber and has a thickness in the range of 3mm to 15mm, the light-transmitting and flexible rigid stamper base is made of a material selected from the group consisting of glass, quartz, sapphire, acrylic resins, and rigid polyvinyl chloride and has a thickness in the range of 0.1mm to 1.0mm, the light-transmitting stamper buffer layer is made of a material selected from the group consisting of acrylic resins, polyurethane rubber and silicone rubber and has a thickness in the range of 10 µm to 150 µm and a Young's modulus in the range of 1 MPa to 100 MPa, and the light-transmitting patterned stamp layer is made of a material selected from the group consisting of polyester resins and acrylic resins and has a Young's modulus in the range of 1 GPa to 5GPa and a thickness in the range of 0.1 µm to 10 µm.

3. The nanoimprint stamper according to claim 1, wherein the light-transmitting rigid substrate, the light-transmitting resilient plate, the light-transmitting and flexible rigid stamper base, the light-transmitting stamper buffer layer, and the light-transmitting patterned stamp layer are combined to form an integral unit.

4. The nanoimprint stamper according to claim 1, wherein the second member is provided detachable from the first member by a vacuum adsorption means.

5. The nanoimprint stamper according to claim 4, wherein the vacuum adsorption means is an annular groove provided in the lower surface of the light-transmitting resilient plate and the inside diameter of the annular groove is greater than the outside diameter of the light-transmitting patterned stamp layer.

6. The nanoimprint stamper according to claim 4, wherein the vacuum adsorption means is a spiral groove provided in the lower surface of the light-transmitting resilient plate and the inside diameter of the outermost circle of the spiral is greater than the outside diameter of the light-transmitting patterned stamp layer.

7. The nanoimprint stamper according to claim 1, wherein the light-transmitting patterned stamp layer has a release treated film deposited on its outer surface.

8. A fine-structure transfer apparatus which uses the nanoimprint stamper according to claim 1 as a mold.

9. A fine-structure transfer apparatus which uses the nanoimprint stamper according to claim 2 as a mold.

10. A fine-structure transfer apparatus which uses the nanoimprint stamper according to claim 3 as a mold.

11. A fine-structure transfer apparatus which uses the nanoimprint stamper according to claim 4 as a mold.

12. A fine-structure transfer apparatus which uses the nanoimprint stamper according to claim 5 as a mold.

13. A fine-structure transfer apparatus which uses the nanoimprint stamper according to claim 6 as a mold.

14. A fine-structure transfer apparatus which uses the nanoimprint stamper according to claim 7 as a mold.

* * * * *